US011681164B2

(12) United States Patent
Jamshidi et al.

(10) Patent No.: US 11,681,164 B2
(45) Date of Patent: Jun. 20, 2023

(54) ELECTRICAL INTERCONNECTS WITHIN ELECTRONIC CONTACT LENSES

(71) Applicant: Spy Eye, LLC, Palo Alto, CA (US)

(72) Inventors: Babak Jamshidi, Menlo Park, CA (US); Ben H. Shelef, Saratoga, CA (US)

(73) Assignee: Tectus Corporation, Saratoga, CA (US)

( * ) Notice: Subject to any disclaimer, the term of this patent is extended or adjusted under 35 U.S.C. 154(b) by 1306 days.

(21) Appl. No.: 16/047,737

(22) Filed: Jul. 27, 2018

(65) Prior Publication Data

US 2020/0033637 A1    Jan. 30, 2020

(51) Int. Cl.
G02C 7/08        (2006.01)
G02C 7/04        (2006.01)
H05K 1/02        (2006.01)
H05K 3/30        (2006.01)
H05K 1/18        (2006.01)

(52) U.S. Cl.
CPC ............. *G02C 7/083* (2013.01); *G02C 7/049* (2013.01); *H05K 1/0274* (2013.01); *H05K 1/189* (2013.01); *H05K 3/301* (2013.01); *H05K 2201/10121* (2013.01)

(58) Field of Classification Search
CPC ........ G02C 7/083; G02C 7/049; G02C 11/10; G02C 7/04; G02C 7/08; H05K 1/0274; H05K 3/301; H05K 1/189; H05K 2201/10121; H05K 2201/10151; H05K 2201/2054

See application file for complete search history.

(56) References Cited

U.S. PATENT DOCUMENTS

| | | | |
|---|---|---|---|
| 5,682,210 | A | 10/1997 | Weirich |
| 6,544,193 | B2 | 4/2003 | Abreu |
| 8,721,074 | B2 | 5/2014 | Pugh et al. |
| 8,786,675 | B2 | 7/2014 | Deering |
| 9,009,958 | B2 | 4/2015 | Etzkorn |
| 2009/0204207 | A1 | 8/2009 | Blum |
| 2009/0279050 | A1 | 11/2009 | McGinn |
| 2010/0076553 | A1 | 3/2010 | Pugh |

(Continued)

OTHER PUBLICATIONS

International Search Report and Written Opinion for App. No. PCT/US2020/048286, dated Oct. 6, 2020, 16 pages.

*Primary Examiner* — Stephone B Allen
*Assistant Examiner* — Gabriel A Sanz
(74) *Attorney, Agent, or Firm* — Fenwick & West LLP (57) ABSTRACT

An electronic contact lens contains electrical components connected by an electrical interconnect. The electrical interconnect has a flat body, with electrical conductors running length-wise along the body. The flat body is oriented perpendicular rather than parallel to the inner and outer surfaces of the contact lens to reduce a visible profile of the interconnect, reducing the amount of light blocked from entering the eye. The body has a curvature shaped to conform to the curvature of the contact lens. As examples, the interconnect may be connected with an electrical component using a tab perpendicular to the flat body of the interconnect, or by forming an edge connection with electrical contacts of the component located along an edge of the component, or through one or more exposed vias formed on the component.

27 Claims, 11 Drawing Sheets

(56) References Cited

U.S. PATENT DOCUMENTS

| | | |
|---|---|---|
| 2010/0103368 A1 | 4/2010 | Amirparviz |
| 2013/0041245 A1* | 2/2013 | Cerboni ............... A61B 5/6821 600/398 |
| 2013/0135578 A1* | 5/2013 | Pugh ..................... G02C 7/083 351/159.39 |
| 2013/0194540 A1 | 8/2013 | Pugh |
| 2013/0258275 A1 | 10/2013 | Toner et al. |
| 2014/0002788 A1* | 1/2014 | Otts ........................ G02C 7/04 351/159.03 |
| 2014/0273316 A1 | 9/2014 | Pugh |
| 2016/0274377 A1 | 9/2016 | Toner |
| 2017/0176774 A1 | 6/2017 | Linhardt |
| 2017/0270636 A1* | 9/2017 | Shtukater ............... G02C 11/10 |
| 2018/0045980 A1* | 2/2018 | Linhardt .......... B29D 11/00817 |
| 2018/0104921 A1 | 4/2018 | Beyad |
| 2018/0115017 A1* | 4/2018 | Muthu ................. A61F 2/1613 |
| 2018/0136492 A1* | 5/2018 | An ....................... A61B 5/6821 |
| 2018/0166665 A1* | 6/2018 | Audeberf ............. H01M 50/10 |
| 2019/0011809 A1 | 1/2019 | Wippermann |
| 2019/0094981 A1 | 3/2019 | Bradski |
| 2019/0109536 A1 | 4/2019 | Lee |
| 2019/0243130 A1 | 8/2019 | Lamkin |
| 2019/0293964 A1* | 9/2019 | Takaki ..................... G02B 5/00 |

* cited by examiner

ELECTRICAL INTERCONNECTS WITHIN ELECTRONIC CONTACT LENSES

BACKGROUND

1. Technical Field

This disclosure generally relates to contact lenses and in particular to contact lenses carrying electrical payloads.

2. Description of Related Art

Contact lenses can include electrical components that provide various capabilities. For example, a contact lens can include one or more projectors, sometimes referred to as femtoprojectors, to enable augmented reality functionality. Electrical components within the contact lens may be connected by one or more conductive elements, in order to transfer power or data between the electrical components.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

An electronic contact lens may contain electrical components, such as integrated circuits, a battery, a coil, an antenna, accelerometers, magnetometers, and/or very small projectors and imaging systems. An electrical interconnect provides electrical connection between different components. The electrical interconnect has a flat body, with electrical conductors running length-wise along the interconnect body. The flat body is oriented perpendicular (rather than parallel) to the inner and outer surfaces of the contact lens. This reduces the visible profile of the interconnect, which reduces the amount of light entering the eye that is blocked by the interconnect. The body has a curvature shaped to conform to the curvature of the contact lens, allowing the electrical interconnect to be mounted in the contact lens without bending or deforming the main body of the interconnect.

The interconnect has contacts or pads that make electrical contact with corresponding contacts on the component being connected. In some cases, the surface containing the component contacts is oriented so that it is perpendicular to the flat body of the interconnect (i.e., parallel to the surface of the contact lens). The connections between the component contacts and the corresponding interconnect contacts may be made using several different techniques.

In some cases, the electrical interconnect has a tab that is perpendicular to the flat body of the interconnect. For example, the flat body and tab may be formed from a flexible printed circuit board, which is folded at a joint between the tab and the flat body. The tab contains the contacts for the interconnect, and a flat surface on the component (e.g., an integrated circuit) contains the component contacts. The tab and the flat surface abut each other, allowing the corresponding contacts to be electrically connected.

In other cases, the electrical interconnect is connected to the component via an edge connection. For example, the edge of the component may abut the flat body of the electrical interconnect. If the component contacts and the contacts on the interconnect are both located close to this joint, then an electrical connection may be made between them, for example by solder. In one approach, the component contains vias and the component is sectioned through the vias, so that the edge contains exposed vias. The exposed vias are then connected to corresponding contacts on the body of the interconnect. In an alternative geometry, the top or bottom edge of the interconnect abuts a surface of the component. Again, if the component contacts and the contacts on the interconnect are both located close to this joint, then an electrical connection may be made.

Figure 1A:
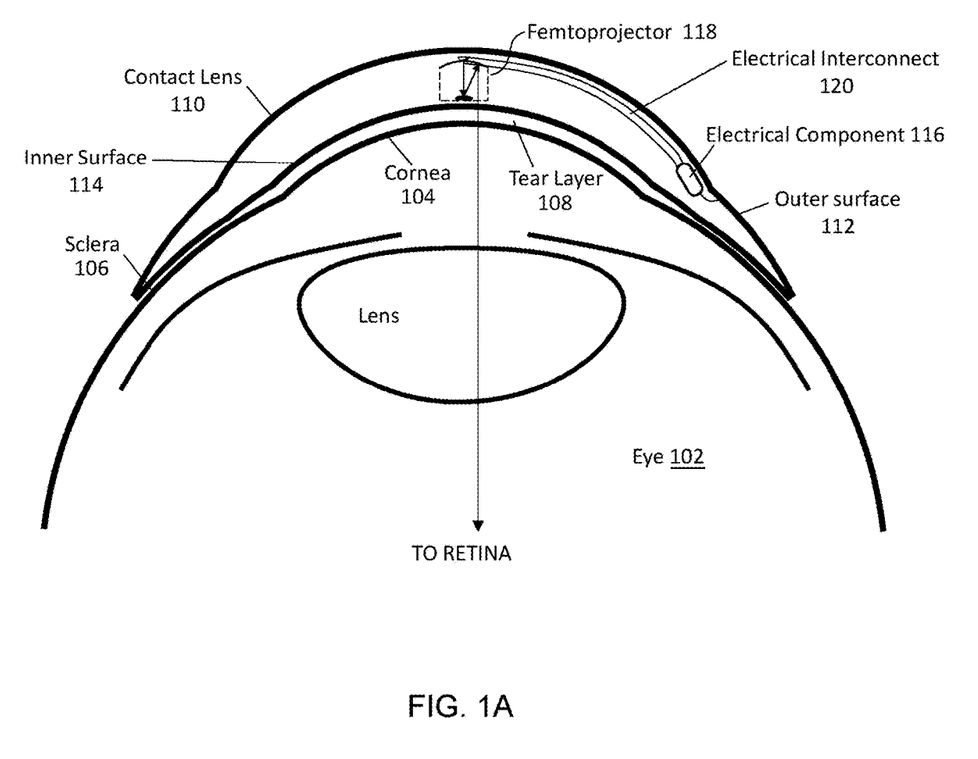
FIG. 1A shows a cross sectional view of a contact lens having an electrical interconnect and mounted on an eye, in accordance with some embodiments.
Figure 1B:
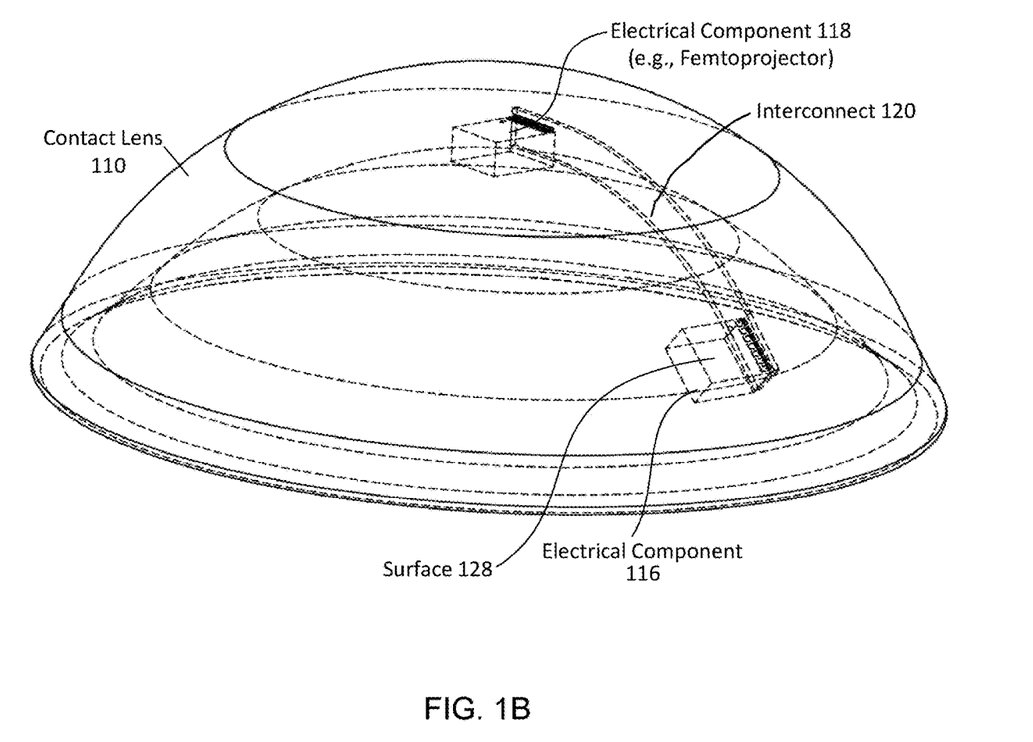
FIG. 1B shows a perspective view of the contact lens having the electrical interconnect, in accordance with some embodiments.

FIGS. 1A and 1B show a cross sectional view and a perspective view of an electronic contact lens 110 mounted on an eye, in accordance with some embodiments. The eye 102 includes a cornea 104 and a sclera 106. In some embodiments, the contact lens 110 is a scleral contact lens designed to contact the sclera 106 and to form a tear fluid layer 108 over the cornea 104. The contact lens 110 has an outer surface 112 and an inner surface 114. As used herein, the outer surface refers to a surface of the contact lens 110 that is distant from the surface of the eye 102 and faces outwards from the wearer when the contact lens 110 is mounted on the wearer's eye, while the inner surface refers to a surface of the contact lens closer to or adjacent to the surface of the eye 102. The outer surface 112 may also be referred to as a "top" surface, while the inner surface 114 may be referred to as a "bottom" surface.

The contact lens 110 contains electrical components, such as a small projector 118 (referred to as a femtoprojector) configured to project images onto the wearer's retina, as well as electrical component(s) 116. Other payloads in the contact lens may include passive devices, such as a coil or antenna for wireless power or data transmission (not shown in the view illustrated in FIG. 1). In some embodiments, one or more active electronic components, such as the femtoprojector 118, are located on a portion of the contact lens 110 through which light passes on its way to the retina. These components may block some light from the outside world from reaching the retina of the eye 102. On the other hand, components such as the electrical components 116 may be located in a portion of the contact lens 110 that does not affect the wearer's view of the outside world (e.g., due to little or no light passing through those portions of the contact lens to reach the retina).

In some embodiments, the electrical components 116 may comprise integrated circuits, imagers, projectors, sensors such as accelerometers or magnetometers, and/or power storage and generation devices such as batteries, power coils, capacitors, photovoltaic cells, or mechanical motion harvesters. In some embodiments, power and data may be transmitted and received by the contact lens 110 from external sources via inductive coupling. For example, the contact lens 110 may comprise a coil (not shown in FIG. 1) electrically connected to the electrical components 116 configured to receive power and/or data from external sources.

The various electrical components within the contact lens 110 may be connected by wires or other conductive elements, allowing for power and/or data to be transmitted between them. For example, in some embodiments, the femtoprojector 118 receives power and data from electrical components 116 located in the periphery of the lens via an electrical interconnect 120. Although FIG. 1 shows only one femtoprojector 118 and one electrical interconnect 120 in the contact lens 110, in some embodiments, a contact lens may contain many femtoprojectors and electrical interconnects. In some embodiments, the electrical interconnect 120 extends substantially parallel to the outer surface 112 or the inner surface 114 of the contact lens 110. The body of the electrical interconnect 120 may be curved to match the curvature of the outer surface 112 and/or the inner surface 114 of the contact lens 110.

The electrical components may have specific orientations within the contact lens 110. For example, in order for the femtoprojector 118 to project light towards the retina of the wearer's eye, it has a certain orientation within the contact lens 110. As another example, the electrical component 116 may be a chip (i.e., an integrated circuit) with a substantially flat body containing a plurality of electrical contacts (e.g., pads) on the upper or lower surface of the flat body. In order to be accommodated within the contact lens 110, the electrical component 116 may be oriented to be substantially parallel to the surface of the contact lens 110 (e.g., such that the upper and lower surfaces of the electrical component 116 are aligned with the inner surface or outer surface of the contact lens 110). As used herein, a component having a flat body is oriented horizontally if the flat body of the component is substantially parallel to the surface of the contact lens 110, and oriented vertically if perpendicular to the surface of the contact lens 110.

The electrical interconnect 120 has a substantially flat body containing a plurality of parallel electrical conductors for transmitting power or data between the electrical components connected to the interconnect. In some embodiments, the electrical conductors are arranged in a linear array across the flat body of the interconnect 120, similar to a ribbon cable, and connect a first set of electrical contacts on the interconnect 120 to a second set of electrical contacts. Each set of electrical contacts is connected to a respective electrical component, thus allowing for power or data to be transmitted between the components. In some embodiments, the flat body of the interconnect 120 may have a width of approximately 200 to 1000 µm, and a thickness of not more than 20 to 100 µm.

In some cases, in order to match the curvature of the contact lens 110, as well as to facilitate connection with the electrical components within the contact lens 110, the interconnect 120 may be formed from a flexible material and oriented such that the flat body of the interconnect is substantially parallel with the surface of the contact lens 110. This orientation allows for greater flexibility of the interconnect, allowing it be to bent or deformed to match the curvature of the contact lens. However, doing so would increase visual profile or cross-section of the interconnect, potentially blocking light from reaching the wearer's retina and thus potentially reducing the wearer's vision.

In some embodiments, the interconnect 120 extends through regions of the contact lens 110 where light en route to the retina of the wearer is likely to pass. For example, as illustrated in FIG. 1B, one electrical component 118 (e.g., a femtoprojector) is located in a central area of the contact lens 110, while the other electrical component 116 is located in a peripheral area of the contact lens 110 (such that it does not block light from reaching the retina). In order to connect these two electrical components, the interconnect 120 extends from the peripheral area of the contact lens 110 to the central area of the contact lens 110. In some embodiments, the interconnect 120 may extend along a radius of the contact lens 110.

The impact of the interconnect 120 on the wearer's vision may be based upon a visual profile or cross-section of the interconnect 120 through areas of the contact lens 110 where light passes through to reach the wearer's retina when the contact lens 110 is worn by the wearer. In order to reduce the visual profile of the interconnect 120, the interconnect 120 is oriented within the contact lens 110 such that the flat body of the interconnect is substantially perpendicular to the inner and outer surfaces of the electronic contact lens (i.e., oriented vertically). This results in the interconnect 120 having a smaller cross-section for potentially blocking light from reaching the wearer's retina.

In order to better fit within the contact lens 110, the flat body of the interconnect 120 is formed to have a curvature that matches the curvature of the contact lens 110. For example, the interconnect 120 may be formed from a printed circuit board (PCB) material, such as a rigid silicon interposer polymer with the parallel electrical conductors printed on using 3D printing, to have the desired curvature. In some embodiments, the interconnect 120 is formed using 3D printing. In other embodiments, the interconnect 120 may be formed by shaping or cutting a shape from a sheet of substrate material having the desired curvature. In some embodiments, the interconnect 120 is made by plating conductive traces onto a flexible or rigid substrate with a curvature based upon that of the contact lens 110. By forming the interconnect 120 to have a curvature based on that of the contact lens 110, the interconnect 120 can be mounted having a perpendicular orientation within the contact lens 110 without needing to bend, fold, or otherwise deform the interconnect to match the curvature of the contact lens 110 when the lens is assembled. This reduces structural stress on the interconnect 120 and the electrical conductors of the interconnect 120.

As illustrated in FIG. 1B, the body of the interconnect 120 has two flat surfaces, with an inner curved edge closer to the inner surface of the contact lens 110 and an outer curved edge closer to the outer surface of the contact lens 110. The inner and outer curved edges have a curvature based upon the curvature of the inner and outer surfaces of the contact lens 110, respectively. In some embodiments, the electrical contacts and electrical conductors are formed on one of the flat surfaces of the interconnect 120.

The interconnect 120 is electrically connected to the electrical components 118 and 116 to form an electrical assembly. In some embodiments, the electrical assembly is assembled outside the contact lens 110, and then inserted into the contact lens 110 (e.g., through one or more slots on the outer surface or inner surface of the contact lens). In other embodiments, the contact lens 110 is cast around the electrical assembly. By forming the interconnect body to have a curvature matching that of the contact lens 110, the interconnect can thus be used to form the electrical assembly separately and independently from the contact lens 110, and later integrated into the contact lens 110 without having to further bend or deform the assembly to fit into the contact lens 110.

In many cases the electrical components within the contact lens 110 are oriented such that a surface of the electrical components containing contacts (e.g., pads) is perpendicular to the flat body of the interconnect 120. For example, as illustrated in FIG. 1B, the second electrical component 116 may be an integrated circuit having one or more contacts located on a top surface 128 that is perpendicular to the flat body of the interconnect 120. This may create difficulties in connecting the contacts on the electrical component to the interconnect. Several different techniques may be used.

Figure 2:
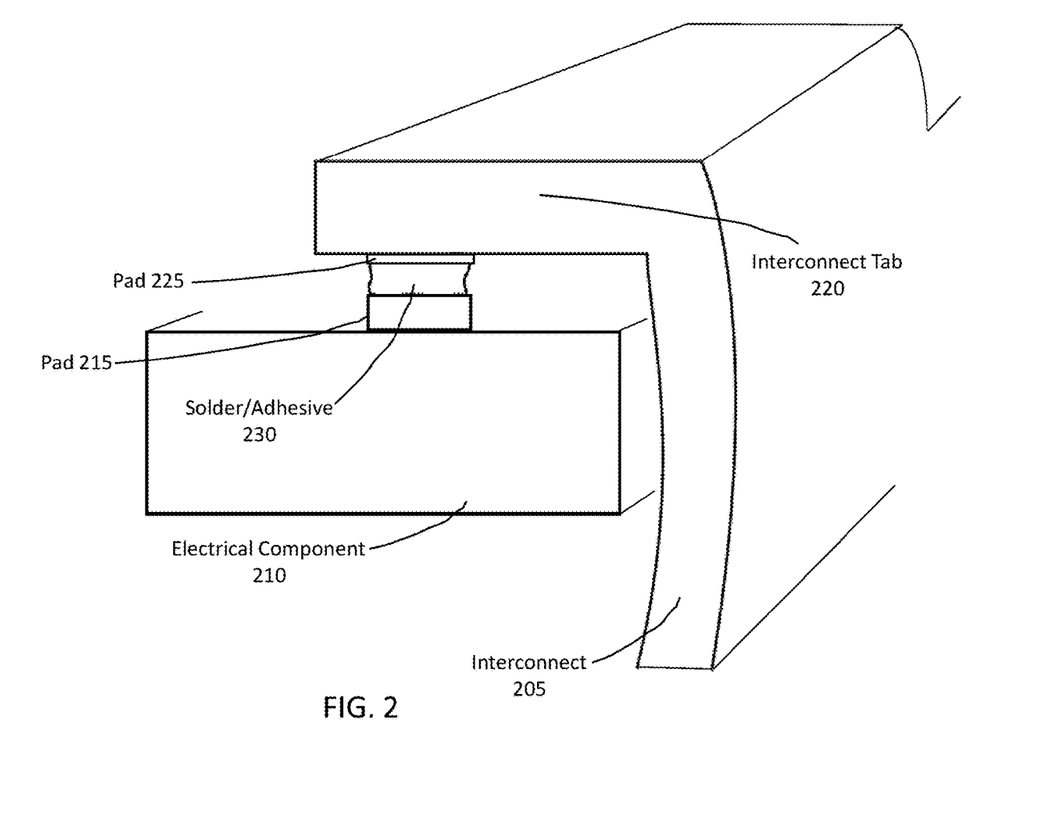
FIG. 2 shows an example of an electrical interconnect having a bent tab, in accordance with some embodiments.

In some embodiments, the interconnect is formed to have a bent tab mechanically attached to and perpendicular to the flat body of the interconnect and parallel with the contact surface of the electrical component. FIG. 2 shows an example of an electrical interconnect having a bent tab, in accordance with some embodiments. As illustrated in FIG. 2, the interconnect 205 has an elongated flat body oriented in a vertical orientation. On the other hand, the electrical component 210 is oriented in a horizontal orientation, such that a surface of the electrical component 210 containing an electrical contact (pad) 215 (e.g., the upper surface) is oriented horizontally.

The interconnect 205 comprises a tab 220 that extends from and is substantially perpendicular to the main body of the interconnect. The tab 220 has a surface that is oriented parallel to the surface of the electrical component 210 containing the pad 215. The tab surface contains one or more electrical contacts or pads 225 corresponding to the pads 215 of the electrical component 210. The surfaces of the electrical component 210 and the tab 220 are positioned within close proximity of each other, such that the pad 215 of the electrical component 210 can be electrically connected to the corresponding pad 225 on the tab 220 (e.g., via solder or adhesive 230).

In some embodiments, the tab 220 is sized such that the surface of the tab has a similar or smaller visual profile in comparison to the electrical component 210. As such, the effect of the tab 220 on the wearer's vision may not be significant, since the tab 220 and the electrical component 210 will visually overlap each other. If the electrical component 210 is located in an area of the contact lens where light does not pass through to reach the retina, the tab 220 may have a larger surface area, since the blocking of light through the contact lens is less of a concern.

Figure 3:
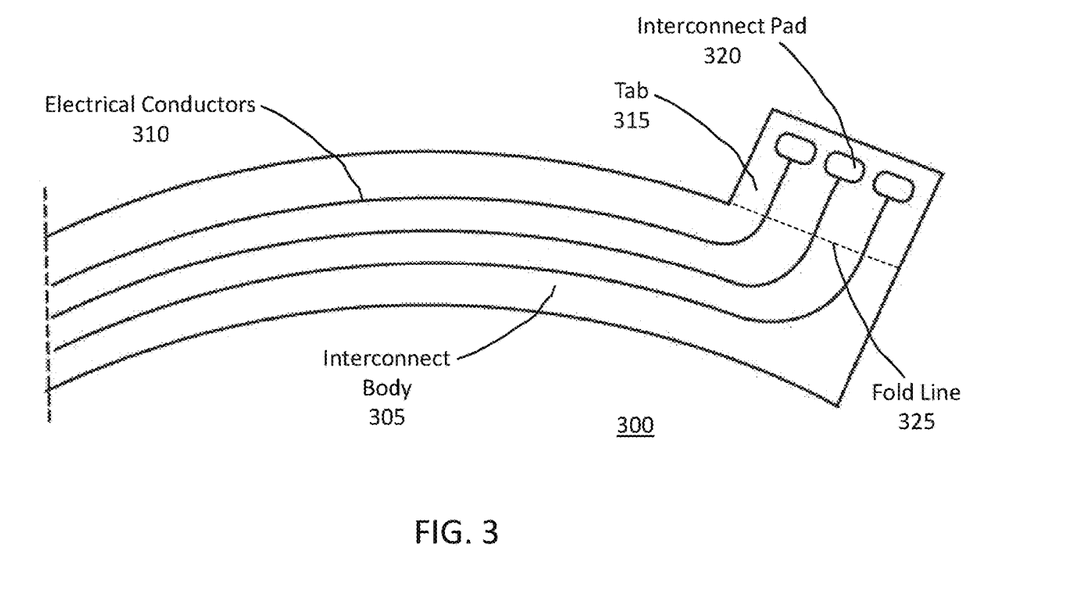
FIG. 3 shows an example of forming a bent tab on an electrical interconnect, in accordance with some embodiments.

FIG. 3 shows an example of forming a tab on an electrical interconnect, in accordance with some embodiments. The interconnect 300 has a main body 305 that is elongated and flat in form, and has a curvature that matches a curvature of a contact lens to which the interconnect 300 is to be attached. The interconnect 300 contains a plurality of electrical conductors 310 arranged in parallel that extend along the length of the main body 305. The tab 315 extends out from the main body 305, and has one or more interconnect pads 320 for connecting to corresponding pads or contacts on an electrical component (not shown). Each interconnect pad 320 is connected to a corresponding electrical conductor 310, which are routed from the tab 315 to run in parallel along the length of the main body 305 of the interconnect.

In some embodiments, the interconnect 300 is manufactured from a piece of flat material, such as a flexible PCB or other substrate. The tab 315 is formed as part of the flat material, extending from and parallel to the main body 305 of the interconnect. Once the interconnect is formed on the PCB or substrate material, the tab 315 is later bent or folded along a fold line 325 to be substantially perpendicular to the main body 305 of the interconnect. In some embodiments, one or more structural elements may be formed along the fold line 325 in order to facilitate bending or folding of the tab 315. For example, in some embodiments, a groove is cut into a surface of the interconnect along the fold line 325, such that the material along the fold line 325 will be thinner than the thickness of the interconnect. In other embodiments, one or more holes or windows are formed through the interconnect material along the fold line 325, creating a perforated fold line that makes the tab 315 easier to fold.

While FIG. 3 illustrates the tab located on one end of the interconnect, in other embodiments, tabs may be formed on other parts of the interconnect (e.g., in the middle of the interconnect). This may be used in cases where the interconnect is used to electrically connect the pads of more than two different electrical components. For example, the interconnect may connect first and second electrical components at tabs located at each end of the interconnect, and a third electrical component at a tab located midway along the body of the interconnect.

In other embodiments, instead of forming the interconnect to have a separate folded tab, one or more electrical contacts or pads are formed on the flat elongated body of the interconnect. The interconnect may then be positioned to abut an edge of the electrical component, and is connected to the electrical component via contacts of the interconnect and the electrical component that are located near the edge.

Figure 4:
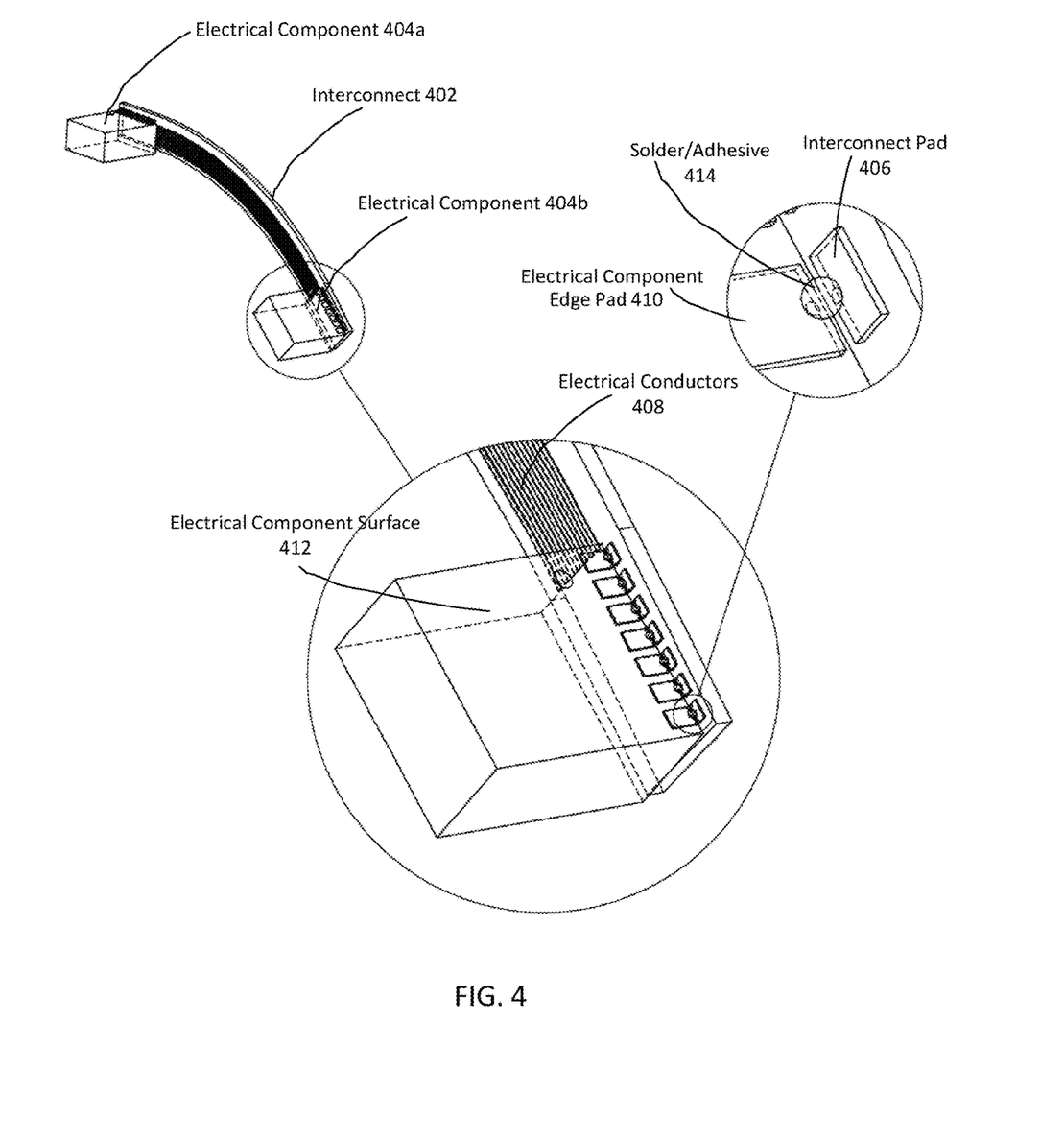
FIG. 4 shows an example of an electrical interconnect formed with electrical contacts formed on the flat body of the interconnect, in accordance with some embodiments.

FIG. 4 shows an example of an electrical interconnect formed with electrical contacts formed on the flat body of the interconnect, in accordance with some embodiments. As illustrated in FIG. 4, the interconnect 402 electrically connects a first electrical component 404a and a second electrical component 404b (collectively, the electrical components 404). The interconnect 402 contains a plurality of interconnect pads 406 arranged on a surface of the elongated flat body of the interconnect. Each of the interconnect pads 406 is connected to a corresponding electrical conductor 408, which are routed to extend in parallel along the length of the elongated body.

In some embodiments, the interconnect pads 406 are arranged in a linear array along the length of a portion of the interconnect body, such that when an electrical component 404 is placed against a side of the interconnect body, the interconnect pads 406 will be adjacent to or within a threshold distance of an edge of the electrical component 404. On the other hand, because the electrical conductors 408 are arranged to run parallel along the length of the interconnect body, the electrical conductors 408 may bend from running in a horizontal direction to a vertical direction, in order to connect to their respective interconnect pads 406.

As illustrated in FIG. 4, at least one of the electrical components 404 (e.g., the second electrical component 404b) contains a plurality of contacts or pads 410 arranged on a surface 412 of the component. The electrical component 404 is positioned adjacent to the body of the interconnect 402, such that an edge of the surface 412 abuts the interconnect body and is within a threshold distance of the interconnect pads 406. For example, the edge of the surface 412 may abut the interconnect body at a point below the interconnect pads 406.

The electrical component 404 contains one or more pads (which may be referred to as edge pads 410) located within a threshold distance of the edge of the surface 412, such that when the electrical component 404 is positioned adjacent to the body of the interconnect 402, the edge pads 410 will be within a threshold distance of the interconnect pads 406, and are able to be electrically connected to the interconnect pads 406 using a solder or adhesive material 414. As such, the interconnect 402 is able to be electrically connected with the electrical components 404, even with the contacts on the interconnect 402 and the electrical components 404 being on perpendicular surfaces.

Figure 5A:
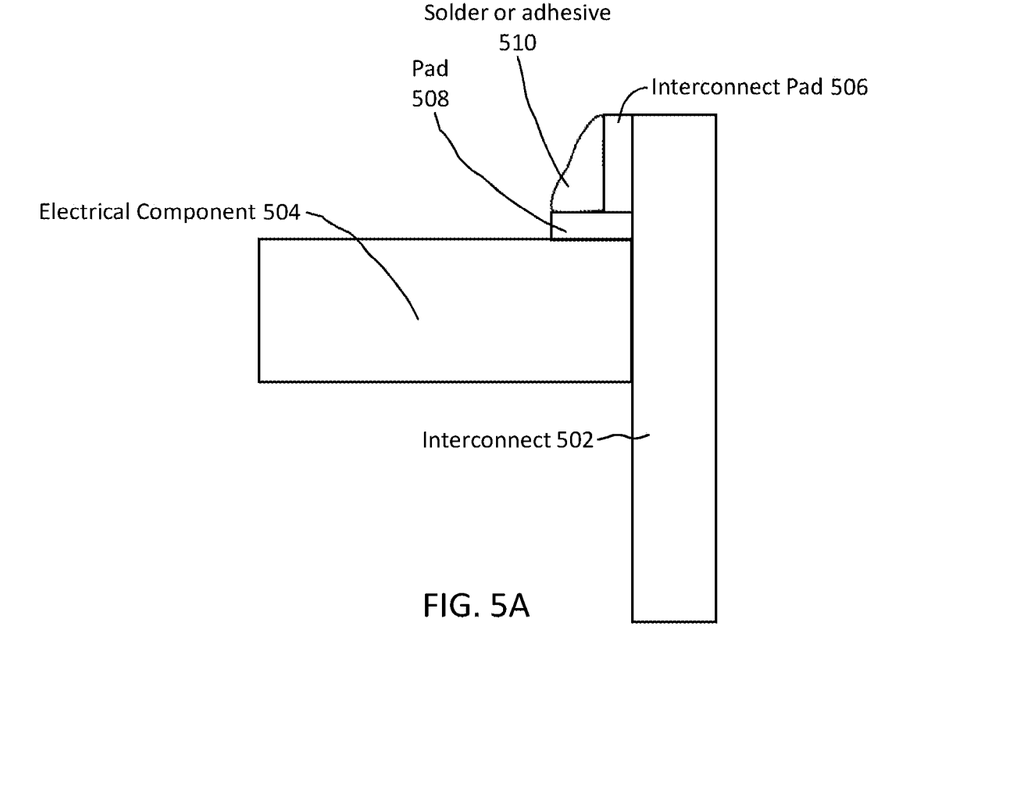
FIGS. 5A-5B show an example of an electrical interconnect that connects to an electrical component along an edge of the electrical component, in accordance with some embodiments.
Figure 5B:
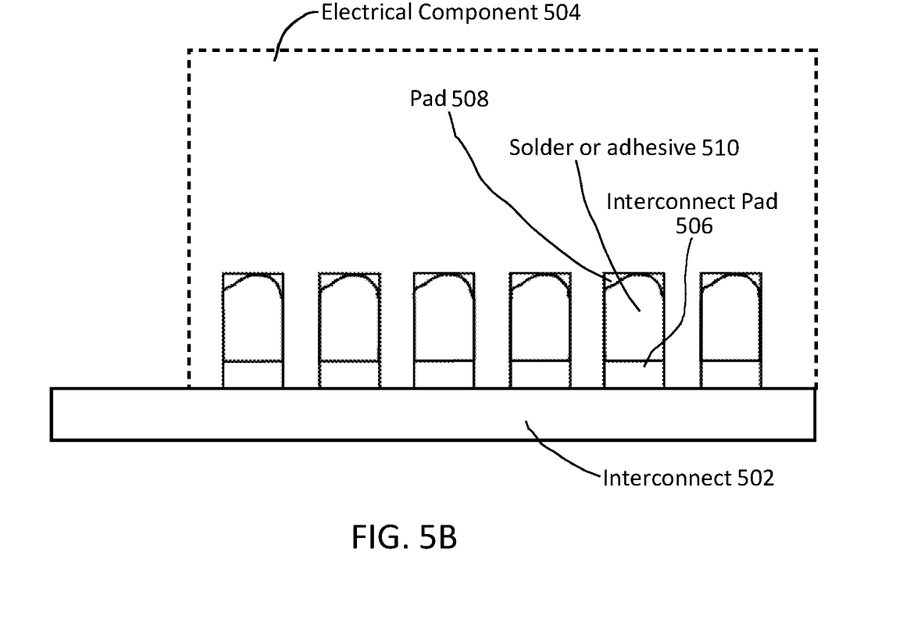

FIGS. 5A-5B show an example of an electrical interconnect that connects to an electrical component along an edge of the electrical component, in accordance with some embodiments. FIG. 5A illustrates a view of an interconnect 502 and electrical component 504 from one end of the elongated body of the interconnect. FIG. 5B illustrates a view of the interconnect 502 and electrical component 504 from above the surface of the electrical component 504 containing the edge pads 508. As illustrated in FIGS. 5A-5B, the electrical component 504 is positioned such that it is directly adjacent to the body of the interconnect 502.

The interconnect 502 has one or more interconnect pads 506 located on a surface of the elongated body. The electrical component 504 contains one or more edge pads 508 located at or within a threshold distance of an edge of the electrical component 504 that directly abuts the body of the interconnect 502. The electrical component 504 is placed adjacent to the interconnect 502 such that the edge pads 508 on the electrical component 504 contact the corresponding interconnect pads 506 on the body of the interconnect 502. In addition, the edge pads 508 and interconnect pads 506 may be held together using solder or a conductive adhesive 510.

In some embodiments, the edge pads 508 and interconnect pads 508 are not in direct contact with each other. Instead, the electrical connection between them is formed entirely through the solder or conductive adhesive 510. For example, in some embodiments the edge pads 508 may be located a certain distance away from the edge of the electrical component 504 and as such do not come into direct contact with the interconnect pads 506 when the electrical component 504 is positioned adjacent to the interconnect 502, but are instead separated by a distance able to be spanned by the solder or adhesive 510, forming the electrical connection.

In some embodiments, the electrical component 404 or 504 may contain additional pads (e.g., pads in other areas on the surface 412) that are not edge pads. Due to their distance from the body of the interconnect, these pads may not be in electrical contact with any interconnect pads. In some embodiments, the electrical component is wired such that any power or data to be transmitted to or from the electrical component can be transmitted through the edge pads. In some embodiments, non-edge pads of the electrical component may be routed to at least one edge pad of the electrical component, such that power or data can be transmitted through the edge pad.

Figure 6:
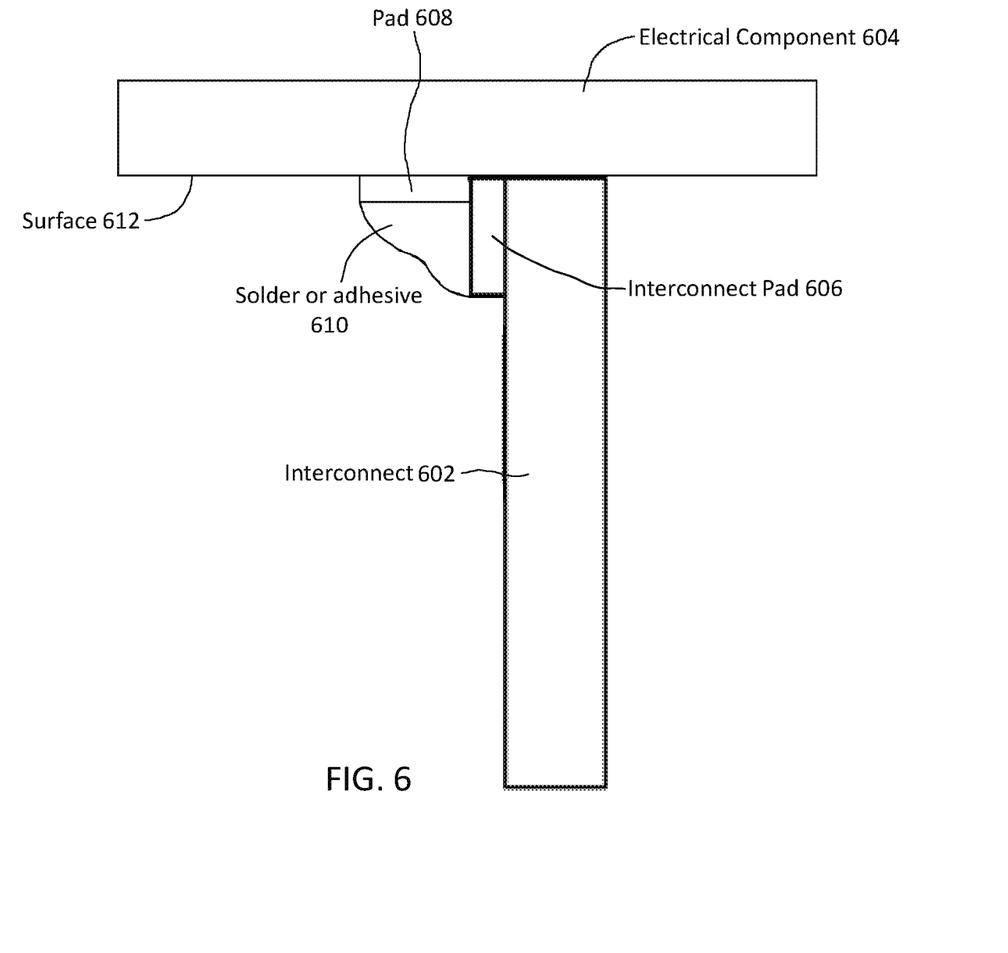
FIG. 6 shows an example of an electrical interconnect that connects to an electrical component at a top surface of the electrical interconnect, in accordance with some embodiments.

While FIGS. 4 and 5A-5B illustrate the electrical component 404 or 504 as positioned adjacent to the flat body of the interconnect 402 or 504, in other embodiments, the electrical component may be positioned above or below the flat body of the interconnect (e.g., adjacent to a top or bottom surface of the interconnect). FIG. 6 shows an example of an electrical interconnect that connects to an electrical component at a top surface of the electrical interconnect, in accordance with some embodiments. The view of the interconnect 602 and electrical component 604 illustrated in FIG. 6 is from one end of the elongated body of the interconnect, similar to the view illustrated in FIG. 5A. However, instead of being positioned adjacent to the body of the interconnect 602, the electrical component 604 is positioned adjacent to and abutting a top surface of the interconnect 602. The pads 608 of the electrical component 604 are located on the surface 612 of the electrical component 604 that is adjacent to the top surface of the interconnect 602, facing the body of the interconnect 602.

As illustrated in FIG. 6, the interconnect pads 606 of the interconnect 602 are located on the surface of the flat body of the interconnect, adjacent to or within a threshold distance of the top surface of the interconnect. As such, when the electrical component 604 is positioned adjacent to the top surface of the interconnect 602, the pads 606 are able to contact pads 608 on the surface 612 of the electrical component 604. The interconnect pads 606 and the pads 608 of the electrical component 604 may be bound together using a solder or conductive adhesive material 610.

In some embodiments, the top surface of the interconnect 602 may abut an area of the surface 612 of the electrical component 604 not near an edge of the surface 612. As such, unlike the pads 508 illustrated in FIGS. 5A and 5B, the pads 608 of the electrical component 604 do not need to be at or near an edge of the surface 612, and may instead be located near the middle of the surface 612. This may allow for increased flexibility when configuring or manufacturing the electrical component 604, as the pads 608 may be located in different locations on the surface 612. However, because the electrical component 604 abuts the top surface of the interconnect 602 instead of the flat body, the total height of the electrical assembly comprising the interconnect and electrical component is increased, and may require a thicker contact lens to accommodate.

In some embodiments, instead of connecting to an electrical component through edge pads (e.g., as illustrated in FIGS. 4-6), the interconnect may be electrically connected to an electrical component through exposed features formed on a side surface of the electrical component. This may allow for an increased surface area for making the electrical connection, potentially improving the reliability and durability of the connection. In some embodiments, the exposed features formed on the electrical component may comprise one or more vias formed on the electrical component and exposed through sectioning the electrical component.

Figure 7A:
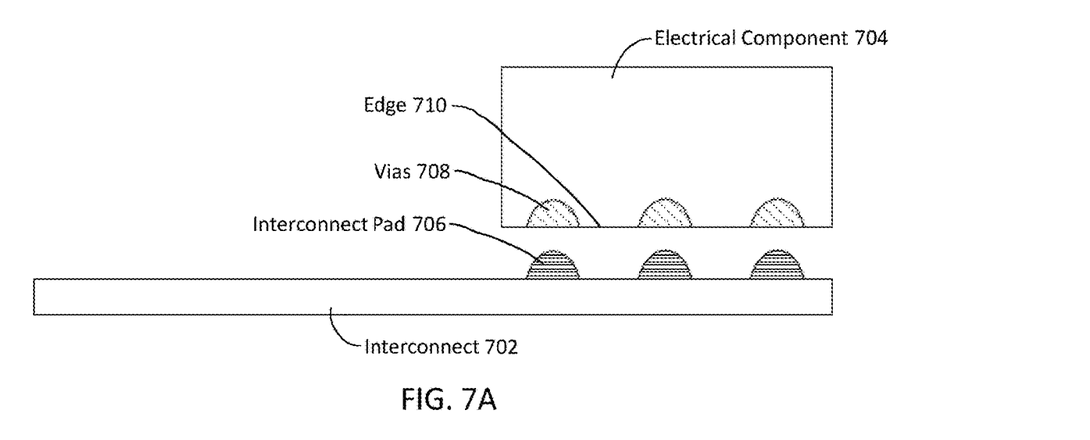
FIGS. 7A-7B show an example of an electrical interconnect that connects to an electrical component through one or more exposed vias along an edge of the electrical component, in accordance with some embodiments.
Figure 7B:
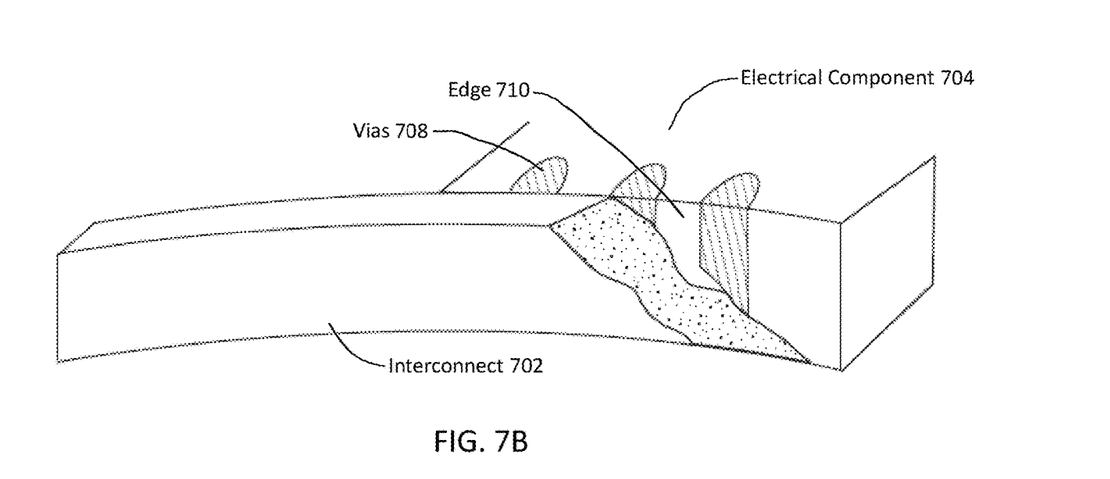

FIGS. 7A-7B show an example of an electrical interconnect that connects to an electrical component through one or more exposed vias along an edge of the electrical component, in accordance with some embodiments. FIG. 7A illustrates a view of an interconnect 702 and an electrical component 704 facing a top surface of the interconnect 702, while FIG. 7B illustrates a perspective view of the interconnect 702 and electrical component 704. The interconnect 702 has an elongated flat body with a plurality of interconnect pads 706 located on a surface thereof. The interconnect pads 706 may be connected to corresponding electrical conductors (not shown), which extend in parallel along the length of the interconnect 702.

The electrical component 704 comprises a plurality of vias 708 formed on an edge 710 of the electrical component 704. In some embodiments, the vias 708 may be through-vias that extend across an entire height of the electrical component 704. In other embodiments, one or more of the vias 708 may extend only partially through the electrical component 704. When the electrical component 704 is positioned to abut the body of the interconnect 702, each via 708 is electrically connected to a corresponding interconnect pad 708 (e.g., via soldering).

In some embodiments, because the vias 708 extend along the edge 710 of the electrical component 704, the amount of surface area contact between the vias 708 and interconnect pads 706 may be larger in comparison to connections between interconnect pads and edge pads as illustrated in FIGS. 4-6, potentially increasing the durability and reliability of the connection, and reducing electrical resistance.

Figure 8A:
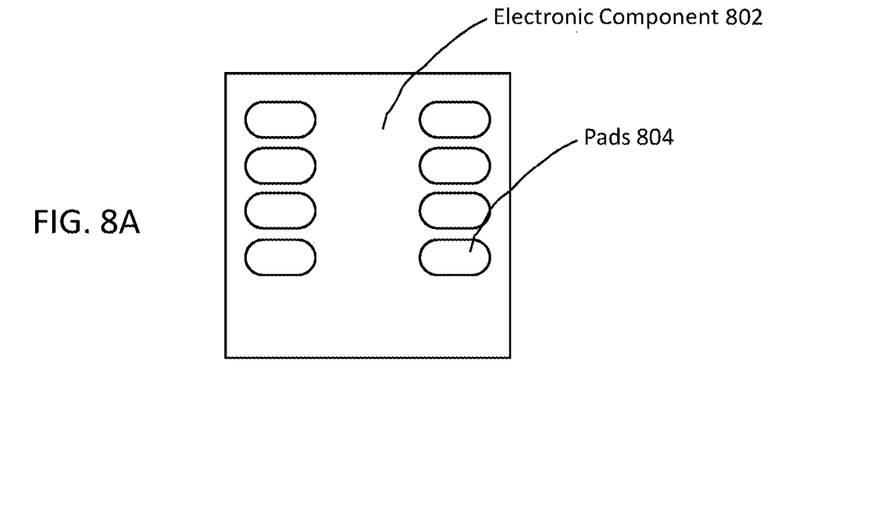
FIGS. 8A-8C shows an example of forming exposed vias along an edge of an electrical component, in accordance with some embodiments.
Figure 8B:
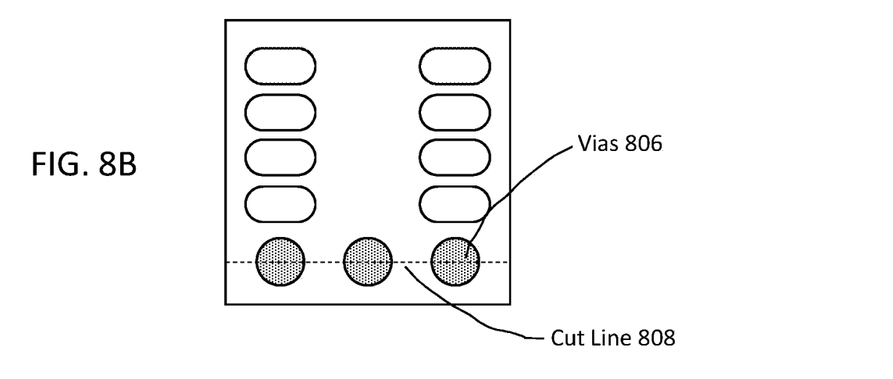

FIGS. 8A-8C shows an example of forming exposed vias along an edge of an electronic component, in accordance with some embodiments. FIG. 8A illustrates an electronic component 802 having a contact surface with a plurality of pads 804. In order to electrically connect the electronic component 802 to pads on an interconnect (not shown), vias 806 are formed on the surface of the electronic component 802, as illustrated in FIG. 8B. In some embodiments, the vias 806 may be through vias extending all the way through the electronic component 802. In other embodiments, the vias 806 may extend only partway through the electronic component 802.

In addition, the electronic component 802 may be configured or wired (not shown) such that the vias 806 are connected to sub-components of the electronic component 802 for sending or receiving power and data. As such, the electronic component 802 will able to transmit or receive power and/or data through the vias 806 instead of or in addition to the pads 804. In some embodiments, the existing pads 804 of the electronic component 802 are electrically connected to corresponding vias 806 through one or more conductive traces.

The vias 806 formed on the electronic component 802 are arranged in a linear array, such that the centers of each of the vias 806 fall on the same line (e.g., the cut line 808). The cut line 808 may correspond to a line that is substantially parallel with an edge of the electronic component 802, and is configured to be close enough to the edge of the electronic component 802 such that sectioning the electronic component 802 through the cut line 808 will not damage any active sub-components of the electronic component 802.

Figure 8C:
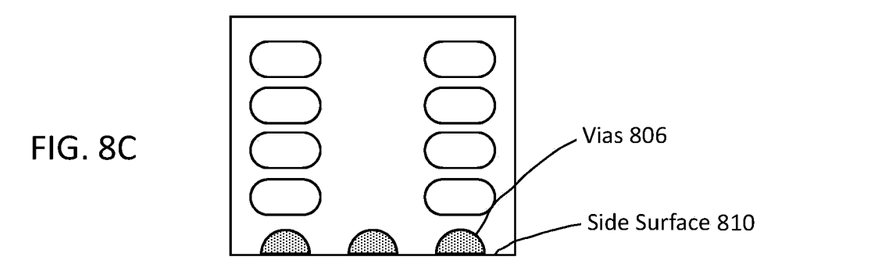

Once the vias 806 have been formed on the electronic component 802, the electronic component 802 is sectioned along the cut line 808, as illustrated in FIG. 8C. This exposes the vias 806 on a newly formed edge 810. The electronic component 802 may then be connected to an interconnect through the vias 806 that are now exposed on the edge 810.

Figure 9:
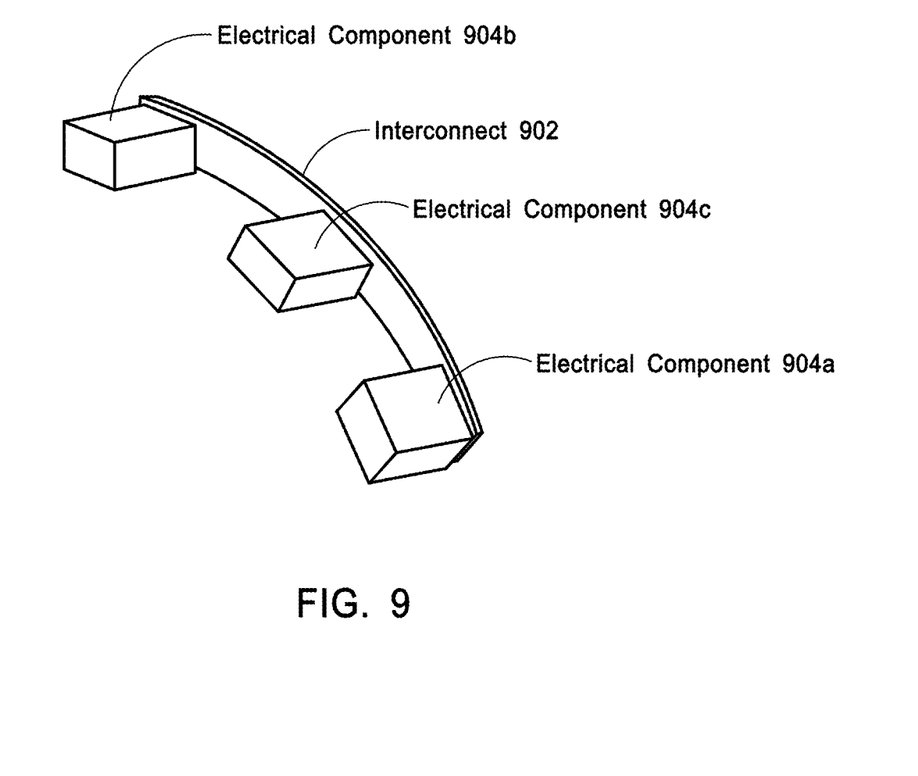
FIG. 9 illustrates an example of an interconnect connected to an electrical component midway along the body of the interconnect, in accordance with some embodiments.

While the above figures primarily illustrate electrical components as being attached near the ends of the interconnect, in other embodiments, one or more electrical components may be attached midway along the length of the interconnect. FIG. 9 illustrates an example of an interconnect connected to an electrical component midway along the body of the interconnect, in accordance with some embodiments. The interconnect 902 of FIG. 9 is electrically connected to a first electrical component 904a, a second electrical component 904b, and a third electrical component 904c through respective first, second, and third sets of electrical contacts. While the first and second electrical component 904a and 904b are connected near the ends of the interconnect 902, the third electrical component 904c is connected to electrical contacts midway along the body of the interconnect 902. The first, second, and third electrical components 904a, 904b, and 904c may transmit power and/or data between each other via the interconnect 902.

Figure 10:
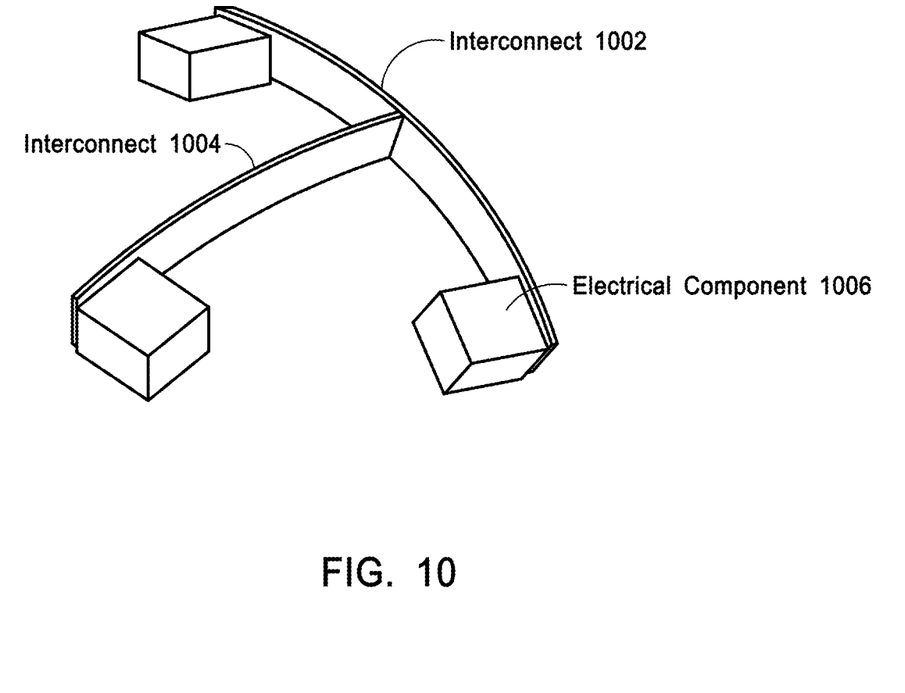
FIG. 10 illustrates an example of interconnects connected to each other, in accordance with some embodiments.

In addition, in some embodiments, two or more different interconnects may be connected to each other. FIG. 10 illustrates an example of interconnects connected to each other, in accordance with some embodiments. For example, a first interconnect 1002 may be connected to a second interconnect 1004, as well as to one or more electrical components 1006. In some embodiments, interconnects may be connected to each other to create branching connections between different electrical components within the contact lens. In other embodiments, interconnects are connected to each other reach different locations of the contact lens. For example, in some embodiments each interconnect within a contact lens extends along a straight line along the curvature of the contact lens. As such, different interconnects extending in different directions may be used to reach different areas of the contact lens.

The second interconnect 1004 may be connected to the first interconnect 1002 using any of the techniques described herein. For example, the second interconnect 1004 may comprise a tab extending from an end surface of the body of the second interconnect 1004 that contacts the body of the first interconnect 1002. In other embodiments, one or more interconnect pads of the second interconnect 1004 may be edge pads adjacent to an edge of the second interconnect 1004. The second interconnect 1004 is positioned adjacent to the first interconnect 1002 such that the edge abuts the body of the first interconnect 1002, such that the edge pads of the second interconnect 1004 can be electrically connected to pads on the body of the first interconnect. In some embodiments, the second interconnect may be formed with one or more vias exposed along an end surface of the second interconnect 1004 that is positioned to abut the body of the first interconnect 1002. By allowing for different interconnects to be connected to each other within the contact lens, the interconnects may be used to connect a greater number of electrical components and reaching a greater number of different locations within the contact lens. Because the flat body of each interconnect is oriented vertically within the contact lens, the visual profile of the interconnects is reduced compared to if the interconnects were oriented horizontally, reducing an impact of the interconnects on the wearer's vision.

Although the detailed description contains many specifics, these should not be construed as limiting the scope of the invention but merely as illustrating different examples. It should be appreciated that the scope of the disclosure includes other embodiments not discussed in detail above. For example, in some embodiments, an interconnect may be connected to different electrical components in different ways (e.g., to a first electrical component via a tab, and to a second electrical component through exposed vias). Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. An electronic contact lens comprising:
   an inner surface by which the electronic contact lens is mountable on a wearer's eye;
   an outer surface that faces outwards from the wearer when the electronic contact lens is mounted on the wearer's eye; and
   an electrical interconnect with a first set of electrical contacts connected by electrical conductors to a second set of electrical contacts, the electrical interconnect having an elongated, curved, flat body with an inner curved edge and an outer curved edge, wherein a first flat surface of the electrical interconnect extending between the inner curved edge and the outer curved edge defines a width of the flat body that is at least twice that of a thickness of the flat body, and wherein the electrical interconnect further comprises a tab that is mechanically attached to and oriented substantially perpendicular to the first flat surface of the electrical interconnect, the first set of electrical contacts located on an outer surface of the tab;
   wherein the first flat surface is oriented substantially perpendicular to the inner and outer surfaces of the electronic contact lens.

2. The electronic contact lens of claim 1, wherein the thickness of the flat body is not more than 100 μm.

3. The electronic contact lens of claim 1, wherein the inner and outer curved edges of the curved, flat body have substantially a same curvature as the inner and outer surfaces of the electronic contact lens.

4. The electronic contact lens of claim 1, wherein the electrical conductors run parallel lengthwise along the elongated, flat body.

5. The electronic contact lens of claim 1, wherein the tab and the flat body are formed from a flexible material folded at a joint between the tab and the flat body.

6. The electronic contact lens of claim 5, wherein the tab and the flat body are formed from a flexible printed circuit board folded at a joint between the tab and the flat body.

7. The electronic contact lens of claim 5, wherein the flexible material is perforated along the joint between the tab and the flat body.

8. The electronic contact lens of claim 1, further comprising:
   an electrical component having a surface that abuts to the outer surface of the tab, said surface of the electrical component containing a set of electrical contacts that are electrically connected to the first set of electrical contacts on the outer surface of the tab.

9. The electronic contact lens of claim 1, wherein the flat body has a second flat surface opposing the first flat surface, and the first set of electrical contacts is located on the first flat surface.

10. The electronic contact lens of claim 9, further comprising:
    an electrical component having a major surface that is substantially perpendicular to the first flat surface of the electrical interconnect and also having an edge of said major surface, the edge of the electrical component containing a set of electrical contacts that are electrically connected to the first set of electrical contacts on the first flat surface of the electrical interconnect.

11. The electronic contact lens of claim 9, further comprising:
    an electrical component having a major surface that is substantially perpendicular to the first flat surface, the major surface of the electrical component containing a set of electrical contacts that are in close proximity to and electrically connected to the first set of electrical contacts on the first flat surface of the electrical interconnect.

12. The electronic contact lens of claim 9, further comprising:
    an electrical component having a major surface that is substantially perpendicular to the first flat surface, an edge surface of defining the thickness of the flat body abutted to said major surface, the electrical component containing a set of electrical contacts that are electrically connected to the first set of electrical contacts on the first flat surface of the electrical interconnect.

13. The electronic contact lens of claim 9, further comprising:
    an electrical component having a major surface that is substantially perpendicular to the first flat surface and also having an edge surface abutted to the first flat surface of the electrical interconnect, the electrical component containing a set of electrical contacts that are electrically connected to the first set of electrical contacts on the first flat surface of the electrical interconnect.

14. The electronic contact lens of claim 1, further comprising:
    an electrical component containing a set of electrical contacts that are electrically connected by solder to the first set of electrical contacts.

15. The electronic contact lens of claim 1, further comprising:
    an electrical component containing a set of electrical contacts that are electrically connected by a conductive adhesive to the first set of electrical contacts.

16. The electronic contact lens of claim 1, further comprising:
    a femtoprojector that is electrically connected to the first set of electrical contacts.

17. The electronic contact lens of claim 1, wherein a length of the elongated, flat body extends along a radius of the electronic contact lens.

18. The electronic contact lens of claim 1, wherein the electrical interconnect further contains a third set of electrical contacts connected by electrical conductors to the second set of electrical contacts, the second set of electrical contacts located along the elongated, flat body between the first and third sets of electrical contacts.

19. The electronic contact lens of claim 1, further comprising:
    a second electrical interconnect containing a set of electrical contacts that are electrically connected to the first set of electrical contacts.

20. The electronic contact lens of claim 1, wherein the flat body is formed of a rigid silicon material.

21. The electronic contact lens of claim 1, wherein the flat body is formed of a flexible printed circuit board.

22. The electronic contact lens of claim 1, wherein the flat body is manufactured by 3-D printing.

23. The electronic contact lens of claim 1, wherein at least a portion of the electrical interconnect extends into a central zone of the electronic contact lens.

24. The electronic contact lens of claim 23, wherein the electrical interconnect is connected to a first electrical component and a second electrical component, the first electrical component located within the central zone of the electronic contact lens, and the second electrical component located outside the central zone of the electronic contact lens.

25. The electronic contact lens of claim 1, wherein the electrical interconnect is oriented such that the inner curved edge of the electrical interconnect is closer to the inner surface of the electronic contact lens than the outer curved edge of the electrical interconnect.

26. An electronic contact lens comprising:
   an inner surface by which the electronic contact lens is mountable on a wearer's eye;
   an outer surface that faces outwards from the wearer when the electronic contact lens is mounted on the wearer's eye;
   an electrical interconnect with a first set of electrical contacts connected by electrical conductors to a second set of electrical contacts, the electrical interconnect having an elongated, curved, flat body with an inner curved edge and an outer curved edge,
   wherein a first flat surface of the electrical interconnect extending between the inner curved edge and the outer curved edge defines a width of the flat body that is at least twice that of a thickness of the flat body,
   wherein the flat body has a second flat surface opposing the first flat surface, and the first set of electrical contacts is located on the first flat surface, and
   wherein the first flat surface is oriented substantially perpendicular to the inner and outer surfaces of the electronic contact lens; and
   an electrical component having a major surface that is substantially perpendicular to the first flat surface of the electrical interconnect and also having an edge of said major surface, the edge of the electrical component containing a set of electrical contacts that are electrically connected to the first set of electrical contacts on the first flat surface of the electrical interconnect, wherein the set of electrical contacts on the edge of the electrical component are sectioned vias through the electrical component that are exposed at the edge of the electrical component.

27. The electronic contact lens of claim 26, where the electrical component is an integrated circuit with contact pads that are electrically connected to the sectioned vias.

* * * * *